US008736316B2

(12) United States Patent
Chaware et al.

(10) Patent No.: US 8,736,316 B2
(45) Date of Patent: May 27, 2014

(54) CURRENT DRIVER WITH OUTPUT CURRENT CLAMPING

(71) Applicants: Virag V. Chaware, Nashua, NH (US); Michael G. Ward, Wells, ME (US)

(72) Inventors: Virag V. Chaware, Nashua, NH (US); Michael G. Ward, Wells, ME (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 13/650,714

(22) Filed: Oct. 12, 2012

(65) Prior Publication Data

US 2014/0103963 A1   Apr. 17, 2014

(51) Int. Cl.
*H03K 3/00* (2006.01)
*H03K 7/02* (2006.01)

(52) U.S. Cl.
USPC ............. 327/108; 327/180; 327/588; 327/84; 326/83

(58) Field of Classification Search
USPC ......... 327/108–112, 180, 309, 312, 316, 321, 327/427, 77, 85, 87, 80, 81, 84, 530, 587, 327/588; 326/82, 83
See application file for complete search history.

(56) References Cited

U.S. PATENT DOCUMENTS

| 5,408,141 | A | 4/1995 | Devore et al. |
| 6,323,703 | B1 | 11/2001 | Fotouhi |
| 6,625,057 | B2 * | 9/2003 | Iwata ............................. 365/158 |
| 6,788,116 | B1 * | 9/2004 | Cook et al. .................... 327/108 |
| 2002/0027456 | A1 | 3/2002 | Barrow |

FOREIGN PATENT DOCUMENTS

WO   WO 2004/092861   10/2004

OTHER PUBLICATIONS

Notification of Transmittal of the International Search Report & Written Opinion of the ISA (including the International Search Report & WO of the ISA) dated Mar. 6, 2014 for International Appl. No. PCT/US2013/062525, 15 pages.

* cited by examiner

*Primary Examiner* — Lincoln Donovan
*Assistant Examiner* — Thomas Skibinski
(74) *Attorney, Agent, or Firm* — Daly, Crowley, Mofford & Durkee, LLP

(57) ABSTRACT

In one aspect, a current driver, includes an operational amplifier that includes a first input port configured to receive a reference signal and a second input port configured to receive a variable signal. The variable signal is a function of an output current of the current driver. The reference signal corresponds to a selected maximum output current of the current driver. The current driver also includes a feedback transistor comprising a gate coupled to the output of the operational amplifier and a summing junction coupled to a drain of the feedback transistor and configured to receive a signal from the drain to enable clamping of the output current of the current driver to the maximum output current when the variable signal exceeds the reference signal. The summing junction is coupled to a set of transistors configured to provide the output current of the current driver.

20 Claims, 5 Drawing Sheets

CURRENT DRIVER WITH OUTPUT CURRENT CLAMPING

BACKGROUND

Cellular phones, cameras, computers and tablet computers include electronic modules such as, for example, a camera module. These electronic modules generally have a power budget. Exceeding the power budget often has undesirable consequences such as quickly reducing battery life or inhibiting functionality in other electronic modules. Sometimes these electronic modules include power limitations such as, for example, an average current being drawn and a maximum current being drawn. If, for example, an electronic module exceeded its maximum current budget, a circuit may be used to reduce the current being drawn. Often this is performed by reducing the power supply to the electronic module which has undesirable consequences such as disabling the electronic module.

SUMMARY in one aspect, a current driver, includes an operational amplifier that includes a first input port configured to receive a reference signal and a second input port configured to receive a variable signal. The variable signal is a function of an output current of the current driver. The reference signal corresponds to a selected maximum output current of the current driver. The current driver also includes a feedback transistor comprising a gate coupled to the output of the operational amplifier and a summing junction coupled to a drain of the feedback transistor and configured to receive a signal from the drain to enable clamping of the output current of the current driver to the maximum output current when the variable signal exceeds the reference signal. The summing junction is coupled to a set of transistors configured to provide the output current of the current driver.

In another aspect, a current driver includes an operational amplifier that includes a first input port configured to receive a reference signal and a second input port configured to receive a variable signal. The variable signal is a function of an output current of the current driver. The reference signal corresponds to a selected maximum output current of the current driver. The current driver also includes a feedback transistor comprising a gate coupled to the output of the operational amplifier and a summing junction coupled to a drain of the feedback transistor and configured to receive a signal from the drain to enable clamping of the output current of the current driver to the maximum output current when the variable signal exceeds the reference signal. The summing junction is coupled to an H-Bridge circuit. The current driver further includes a damping resistor coupled between the summing junction and the H-bridge circuit, the H-bridge circuit configured to provide the output current of the current driver and coupled to an actuator coil and a digital-to-analog converter (DAC) coupled to the feedback transistor and configured to provide the reference voltage.

In a further aspect, a current driver includes a first operational amplifier that includes a first input port configured to receive a reference signal and a second input port configured to receive a variable signal. The variable signal is proportional to an output current of the current driver. The reference signal corresponds to a selected maximum output current of the current driver. The current driver also includes a first feedback transistor that includes a gate coupled to the output of the first operational amplifier; a summing junction coupled to a drain of the first feedback transistor and configured to receive a signal from the drain to enable clamping of the output current of the current driver to the maximum output current when the variable signal exceeds the reference signal. The summing junction is coupled to an H-Bridge circuit. The current driver further includes a damping resistor coupled between the summing junction and the H-bridge circuit, the H-bridge circuit configured to provide the output current of the current driver and coupled to an actuator coil of a camera module having autofocusing functionality, a transconductance amplifier configured to receive an input signal to the current driver, a current gain stage circuit that includes the summing junction and coupled to an output of the transconductance amplifier, a digital-to-analog converter (DAC) coupled to the first feedback transistor and configured to provide the reference voltage, a second operational amplifier comprising a first input coupled to the H-bridge circuit and a second feedback transistor comprising a gate coupled to the output of the second operational amplifier, a drain coupled to an input of the first operational amplifier and a source coupled to the first input of the second operational amplifier.

DESCRIPTION OF THE DRAWINGS

The foregoing features of the invention, as well as the invention itself may be more fully understood from the following detailed description of the drawings, in which.

DETAIL DESCRIPTION

Described herein is a circuit that provides trim using a clamp. In one example, this circuit is a closed loop bi-directional clamp circuit or unidirectional clamp circuit, which may be used, for example, as a driver of a voice coil motor camera module in a cellular phone and, in particular, camera autofocusing applications one particular example, the clamp circuit prevents the camera module from exceeding the allowable, transient current consumption of the camera module due to the limits of the power supply. While an example of the voice coil of a motor camera module is described herein, one of ordinary skill in the art would appreciate that the techniques described herein may be used in any resistive and/or inductive load that requires trim.

Figure 1:
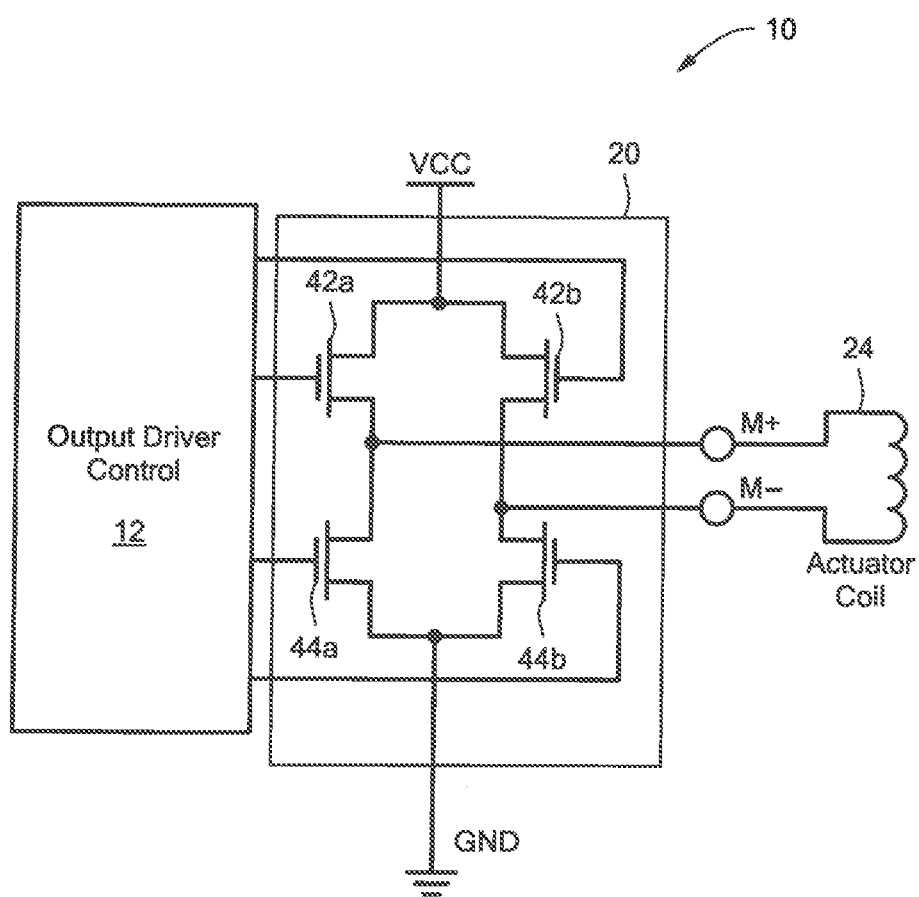
FIG. 1 is a functional block diagram of a circuit that includes a current driver.

Referring to FIG. 1, a circuit 10 includes an output driver control 12, a current driver 20 and an actuator coil 24. The current driver 20 includes an H-bridge circuit that includes two p-metal oxide semiconductor field effect transistors (pMOSFETs) 42a, 42b and two n-metal oxide semiconductor field effect transistors (MOSFETs) 44a, 44b. The current driver 20 includes a terminal M+ and a terminal M−.

In one example, the actuator coil 24 drives a ferromagnetic material such as a hard ferromagnetic material as in a permanent magnet or a soft ferromagnetic material as in examples where the device may only pull on the soft ferromagnetic material. In other examples, the actuator coil 24 drives or moves a lens assembly with a ferromagnetic material.

The output driver control 12 is coupled to the gates of each of the pMOSFETs 42a, 42h and nMOSFETs 44a, 44b and is configured to provide a signal to each of the MOSFET gates to control the current being provided by the current driver 20. The current driver 20 provides a current to one of the M+ terminal and the M− terminal depending on which MOSFETs 42a, 42b, 44a, 44b are activated. In one particular example, when the pMOSFET 42a and the nMOSFET 44b are turned on, the current from a power supply VCC goes through the pMOSFET 42a to the M+ terminal through the actuator coil, out the M− terminal and through the nMOSFET 44b to ground. In another example, when the pMOSFET 42b and the nMOSFET 44a are turned on, a current from the power supply VCC goes through the pMOSFET 42b out the M− terminal, in the M+ terminal and through the nMOSFET 44a to ground. As will be further described herein, the current driver 20 has a clamping function that limits the current output of the current driver to a selected maximum output current.

Figure 2A:
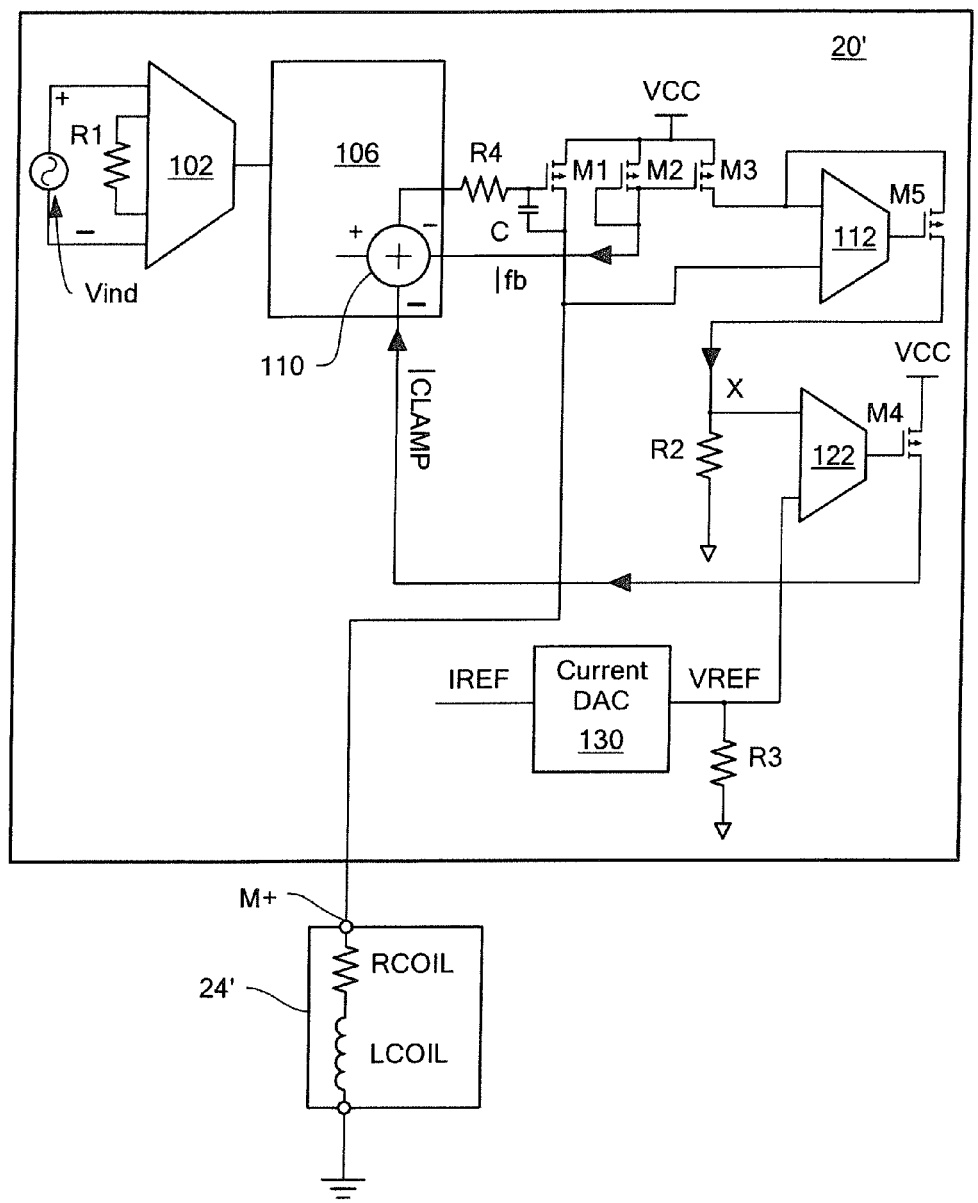
FIG. 2A is a circuit diagram of an example of the current driver and an example representation of a load being driven by the current driver.

Referring to FIG. 2A, one particular example of a current driver 20 is a current driver 20'. The current driver 20 is coupled to and provides current to a load (i.e., an actuator coil 24'). The current driver 20' includes a transconductance amplifier 102 with the gain inversely proportional to resistance of R1. The transconductance amplifier 102 is supplied with an input signal Vind, which is also the input to the current driver 20'. The transconductance amplifier transconductance amplifier 102 represents a first stage with a gain, GM1. In one particular example, GM1 is equal to 4/R1. The output of the transconductance amplifier 102 is coupled to a current gain stage 106.

The current gain stage 106 includes a summing junction 110, which adds an output signal from the transconductance amplifier 102 and subtracts an ICLAMP signal and a feedback signal ifb. A resultant signal from the summing junction 110 is supplied to a damping resistor R4. The current gain stage 106 represents a second stage. In one particular example, if the current gain A2 of the current gain stage 106 is 10 the total gain across the first and second stages is equal to GM1 times A2 or GM1 times 10.

The damping resistor R4 is coupled to a gate of the transistor M1 which is coupled to a transistor 112. The drain of the transistor M1 is coupled to an actuator coil 24' represented by a resistive load RCOIL and an inductive load LCOIL. In one example, the M1 is a pMOSFET used in an H-bridge circuit such as pMOSFETs 42a or 42b (FIG. 1). A capacitor C (e.g., a parasitic Miller capacitor) couples the gate of the transistor M1 and the resistor R4 to the drain of the transistor M1.

The drain of the transistor M2 is coupled to a gate of a transistor M3 and provides the feedback signal ifb to the summing junction 110. The transistors M1 and M3 are current mirrors of the transistor M2. In one example, the transistors M1 and M3 are pMOSFETs. The transistors M1, M2, M3 represent a third stage. In one particular example, if the gain across the third stage current gain A3 is 60, then the gain across the three stages is equal to GM1 times A2 times A3 or GM1 times A2 times 60. In another particular example, if R1 is equal to 20 K ohms, A2 is equal to 10 and A3 is equal to 60 then the actual value of the overall gain is equal to 100 mA/V.

In order to keep the gain of the third stage substantially constant, a drain matching mechanism is used. The drain matching mechanism includes an op amp 112 with an output coupled to a transistor M5. One input of the op snap 112 is coupled to the actuator coil 24' represented by the resistive load RCOIL and the inductive load LCOIL. The other input of the op amp 112 is connected to the drain of the transistor M3 and to the source of the transistor M5. The purpose of the drain matching mechanism is to generate an accurate feedback current proportional to the output current of the current driver 20', which is the current over the actuator coil. The current through transistor M5 is scaled to 1/A3. In one example, the transistor M5 is a pMOSFET.

The drain of the transistor M5 is coupled to a master feedback configuration that includes an op amp 122, a transistor M4 and a current digital-to-analog 130 (DAC). The op amp 122 receives at a first input port a voltage at a point X, voltage X. The point X is coupled to resistor R2 coupled to ground or some other common mode reference voltage and to the drain of the M5 transistor. The voltage X is a variable signal that is proportional to the output of the current driver 20'. In one example, the variable signal is linearly proportional to the output of the current driver 20'. In other examples, the variable signal is non-linearly proportional to the output of the current driver 20', for example, if there is no drain matching mechanism.

The op amp 122 receives at a second input port a signal VREF generated from the output of the current DAC 130. The output of the op amp 122 is coupled to a gate of the transistor M4. The source of the transistor M4 is coupled to the power supply VCC. The drain of the transistor M4 is coupled to the summing junction 110 and when the transistor M4 is turned on, the ICLAMP signal is provided to the summing junction 110.

A current IREF is provided to the current DAC 130. The output of the current DAC 130 is coupled to ground or another reference voltage by a resistor R3. In one example, the current DAC 130 is an n-bit DAC, where n is an integer greater than zero. In one example, n is greater than or equal to three and less than or equal to nine. In one particular example, n is equal to five. A user can use coded bits to control the output of the current DAC 130 and set the VREF signal. The VREF signal corresponds to a maximum output current of the current driver 20'.

If the voltage X remains below the signal VREF, the op amp 122 does not turn on the transistor M4. However, if the voltage X exceeds the signal VREF (i.e., indicating that the current driver will exceed the maximum allowable current), then the transistor M4 is turned on and the ICLAMP signal is sent to the summing junction 110 which will enable a reduction in the signal received from the current gain stage 106 and force the current driver 20' to clamp the output signal substantially at the maximum allowable current.

Drain matching described previously makes the actuator coil part of the master feedback loop. The inductance of the actuator represented by LCOIL and the parasitic capacitance of the transistors M1, M2, M3 form an oscillator circuit which is compensated by the damping resistor R4.

It will be appreciated by one of ordinary skill in the art that current driver 20' in FIG. 2A is a simplified unidirectional representation of the current driver 20 of FIG. 1 and as such not all elements may be necessarily depicted. For example, nMOSFETs in the H-bridge are not depicted in FIG. 2A. Also, one of ordinary skill in the art would appreciate that FIG. 2A could be implemented using nMOSFETs in the H-bridge instead of pMOSFETs by simply inverting the diagram such as shown in FIG. 2B where M1, M1', M6 and M6' form the H-Bridge.

Figure 2B:
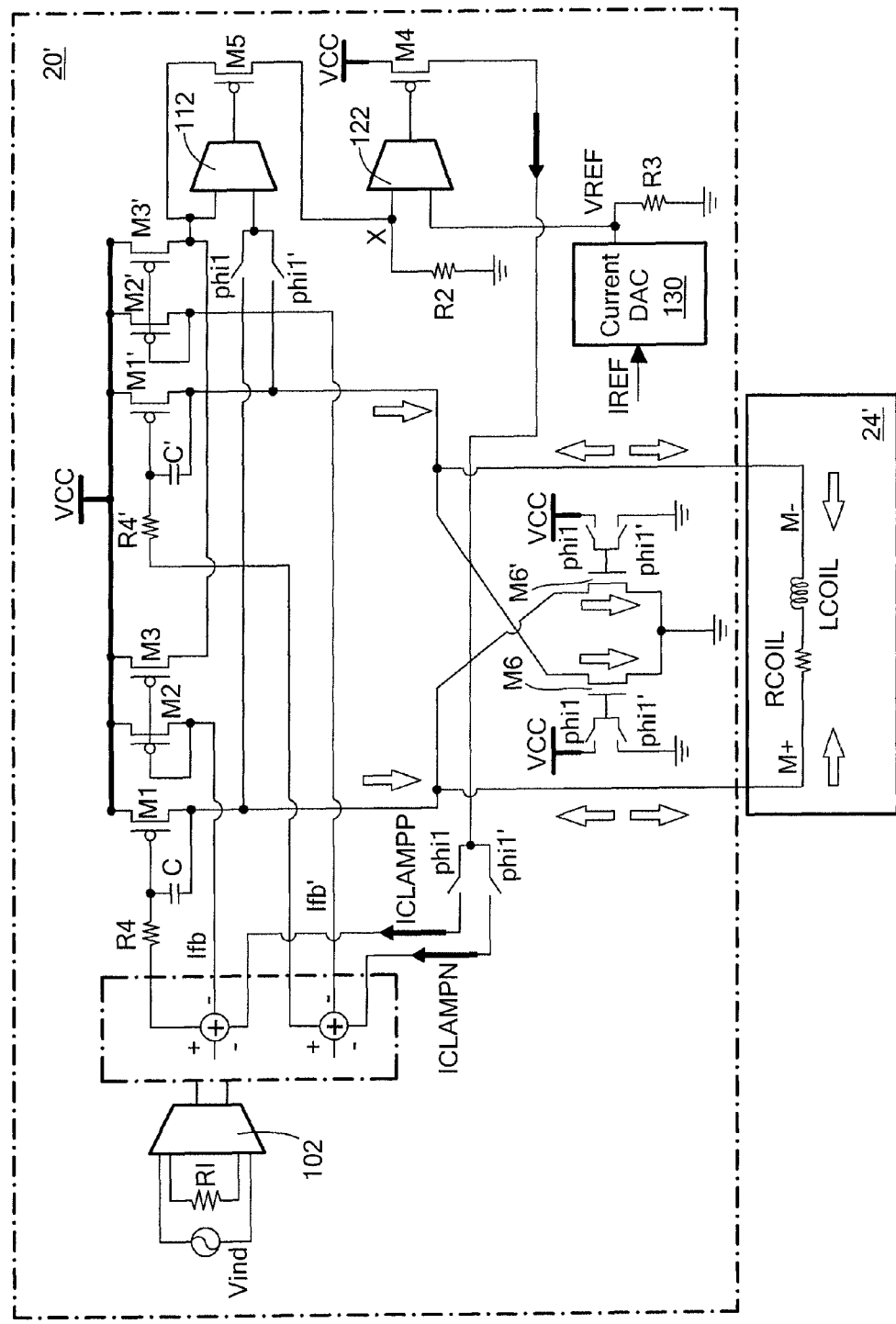
FIG. 2B is a circuit diagram of another example of the current driver and an example representation of a load being driven by the current driver.

In other examples, the ground shown in FIG. 2B may be replaced by a negative potential for example.

Figure 3:
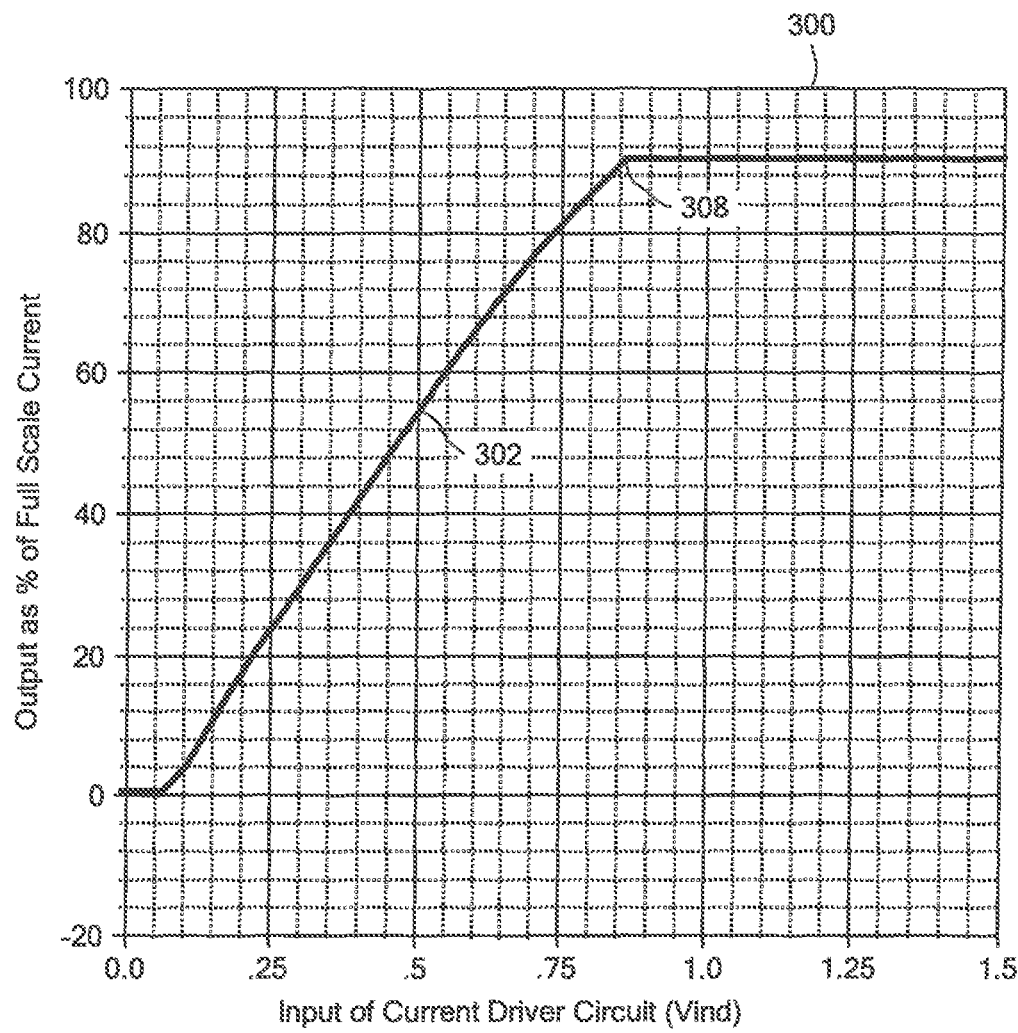
FIG. 3 is a graph of an example of percentage of full scale current versus voltage curve.

Referring to FIG. 3, a graph 300 illustrates the clamping function of the current driver 20'. As the input voltage, Vinci, to the current driver 20' increases the clamping function is not turned on. For example, in the region 302 of the curve the output current increases linearly with increasing input voltage Vind while the output current is below a maximum selected output current. When the output current reaches the maximum selected output current 308, the clamping function is engaged and the output current of the current driver 20' remains substantially constant at the maximum selected output current with increasing input voltage Vind.

Figure 4:
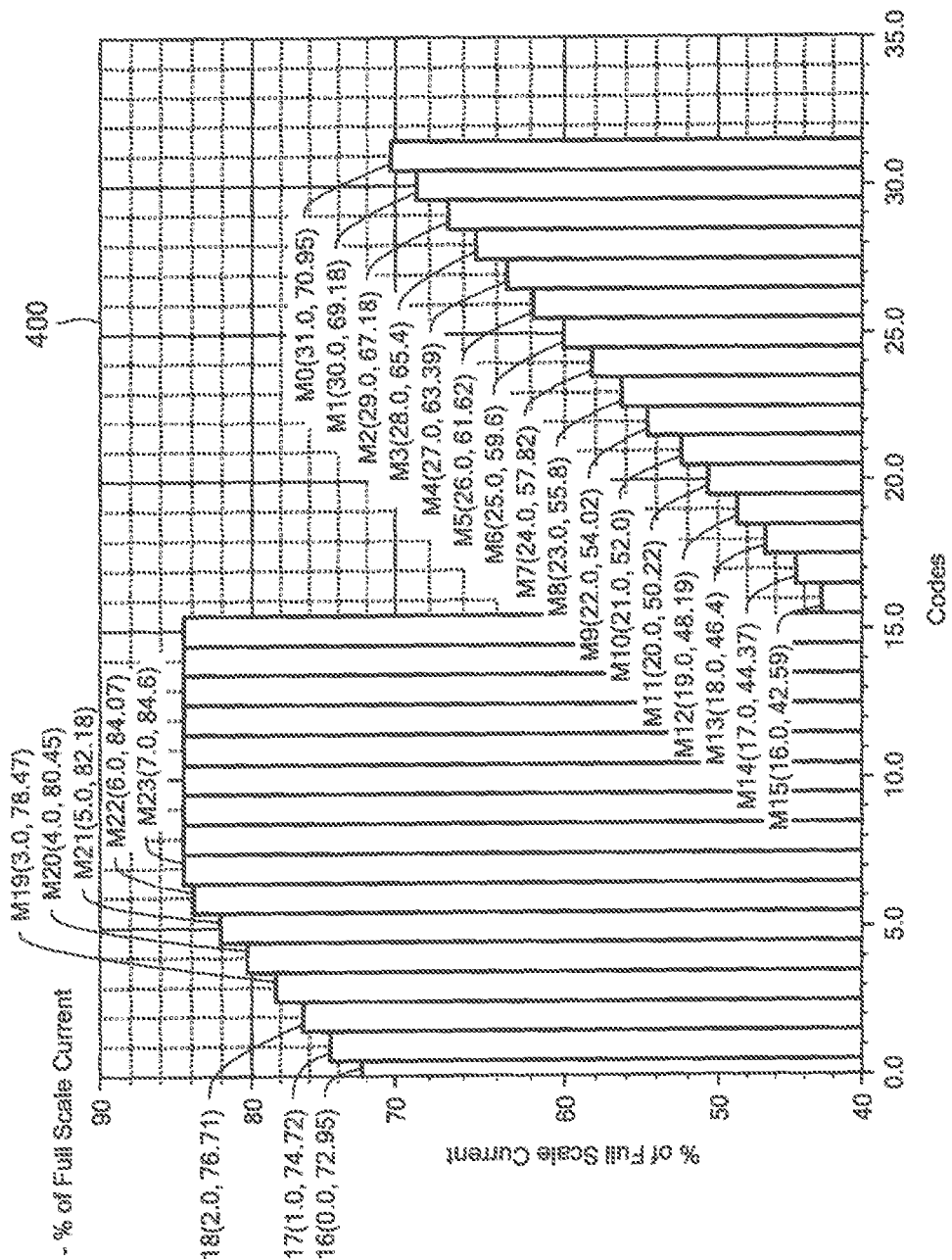
FIG. 4 is a graph of an example of percentage of full scale current versus different codes entered into an 5-bit DAC to set a maximum output current of the driver.

Referring to FIG. 4, a graph 400 of an example of current versus different codes that may be entered into a n-bit DAC to set a maximum output current of the current driver 20'. By selecting a code for the DAC 130, a user is able to control the VREF signal and thereby select a maximum output current provided by the current driver 20'. The graph 400 in FIG. 4 follows a two's complement behavior. For example, the lowest maximum output current starts at code 16 and continues to increase to code 31. The maximum output current continues to increase starting at code 0. In this example, codes 7 to 15 remain flat at about 84.6% of full scale due to limitations in the power supply, VCC. Using other power supplies can increase the maximum output current of 84.6% of full scale to higher values. By using the DAC 130 a user can adjust the maximum output current of the current driver despite variations in processing of the circuit 20', supply voltage characteristics and temperature.

The elements described herein are not limited to the specific examples described. For example, one or more of the operational amplifiers 112, 122 may be an operational transconductance amplifier (OTA). In one example, the transistors M4 and M5 are pMOSFETs. In another example, the circuit 20' may be reconfigured using nMOSFETs rather than pMOSFETs. In a further example, the drain mechanism in FIG. 2 may be removed by removing the op amp 112 and the transistor M5 and directly coupling the drain of the transistor M3 to the point X.

One of ordinary skill in the art would appreciate that the MOSFETs may be replaced by other devices such as, for example, a bipolar junction transistor (BJT) or a double-diffused metal-oxide-semiconductor (DMOS).

Elements of different embodiments described herein may be combined to form other embodiments not specifically set forth above. Other embodiments not specifically described herein are also within the scope of the following claims:

What is claimed is:

1. A current driver, comprising:
   an operational amplifier comprising a first input port configured to receive a reference signal and a second input port configured to receive a variable signal, the variable signal being a function of an output current of the current driver, the reference signal corresponding to a selected maximum output current of the current driver;
   a feedback transistor comprising a gate coupled to the output of the operational amplifier; and
   a summing junction coupled to a drain of the feedback transistor and configured to receive a signal from the drain to enable clamping of the output current of the current driver to the maximum output current when the variable signal exceeds the reference signal, the summing junction being coupled to a set of transistors configured to provide the output current of the current driver,
   wherein at least one of the set of transistors is a mirror of another one of the set of transistors.

2. The circuit of claim 1, further comprising a resistor coupled between the summing junction and the set of transistors.

3. The circuit of claim 1 wherein each of the set of transistors is one of nMOSFETs or pMOSFETs.

4. The circuit of claim 1 wherein at least one of the set of transistors are part of an H-bridge circuit.

5. A current driver, comprising:
   an operational amplifier comprising a first input port configured to receive a reference signal and a second input port configured to receive a variable signal, the variable signal being a function of an output current of the current driver, the reference signal corresponding to a selected maximum output current of the current driver;
   a feedback transistor comprising a gate coupled to the output of the operational amplifier;
   a summing junction coupled to a drain of the feedback transistor and configured to receive a signal from the drain to enable clamping of the output current of the current driver to the maximum output current when the variable signal exceeds the reference signal, the summing junction being coupled to a set of transistors configured to provide the output current of the current driver; and
   an n-bit current digital-to-analog converter (DAC) coupled to the feedback transistor and configured to provide the reference voltage, wherein is n is an integer greater than zero.

6. The circuit of claim 5 wherein n is greater than or equal to three and less than or equal to nine.

7. The circuit of claim 6 wherein n is equal to five.

8. A current driver, comprising:
   an operational amplifier comprising a first input port configured to receive a reference signal and a second input port configured to receive a variable signal, the variable signal being a function of an output current of the current driver, the reference signal corresponding to a selected maximum output current of the current driver;
   a feedback transistor comprising a gate coupled to the output of the operational amplifier;
   a summing junction coupled to a drain of the feedback transistor and configured to receive a signal from the drain to enable clamping of the output current of the current driver to the maximum output current when the variable signal exceeds the reference signal, the summing junction being coupled to a set of transistors configured to provide the output current of the current driver;
   a transconductance amplifier configured to receive an input signal to the current driver; and
   a current gain stage circuit comprising the summing junction and coupled to an output of the transconductance amplifier.

9. The circuit of claim 8, wherein the operational amplifier is a first operational amplifier and the feedback transistor is a first feedback transistor, and
   further comprising:
   a second operational amplifier comprising a first input coupled to the set of transistors; and
   a second feedback transistor comprising a gate coupled to the output of the second operational amplifier, a drain coupled to an input of the first operational amplifier and a source coupled to the first input of the second operational amplifier.

10. The circuit of claim 9 wherein at least one of the first and second operational amplifiers is an operational transconductance amplifier.

11. A current driver, comprising:
   an operational amplifier comprising a first input port configured to receive a reference signal and a second input port configured to receive a variable signal, the variable signal being a function of an output current of the current driver, the reference signal corresponding to a selected maximum output current of the current driver;

a feedback transistor comprising a gate coupled to the output of the operational amplifier; and a summing junction coupled to a drain of the feedback transistor and configured to receive a signal from the drain to enable clamping of the output current of the current driver to the maximum output current when the variable signal exceeds the reference signal, the summing junction being coupled to a set of transistors configured to provide the output current of the current driver, wherein the variable voltage corresponds to the output current of the current driver provided to a load.

12. The circuit of claim 11 wherein the variable voltage is proportional to the output current of the current driver provided to a load.

13. The circuit of claim 12 wherein the variable voltage is linearly proportional to the output current of the current driver provided to a load.

14. The circuit of claim 11 wherein the load is an actuator coil for a camera module.

15. The circuit of claim 14 wherein the camera module comprises autofocusing functionality.

16. A current driver, comprising:

an operational amplifier comprising a first input port configured to receive a reference signal and a second input port configured to receive a variable signal, the variable signal being a function of an output current of the current driver, the reference signal corresponding to a selected maximum output current of the current driver;

a feedback transistor comprising a gate coupled to the output of the operational amplifier;

a summing junction coupled to a drain of the feedback transistor and configured to receive a signal from the drain to enable clamping of the output current of the current driver to the maximum output current when the variable signal exceeds the reference signal, the summing junction being coupled to an H-Bridge circuit;

a damping resistor coupled between the summing junction and the H-bridge circuit;

the H-bridge circuit configured to provide the output current of the current driver and coupled to an actuator coil; and a digital-to-analog converter (DAC) coupled to the feedback transistor and configured to provide the reference voltage.

17. The circuit of claim 16 wherein the variable voltage is proportional to the output current of the current driver provided to the actuator coil.

18. The circuit of claim 17, further comprising:

a transconductance amplifier configured to receive an input signal to the current driver; and a current gain stage circuit comprising the summing junction and coupled to an output of the transconductance amplifier.

19. The circuit of claim 18, wherein the operational amplifier is a first operational amplifier and the feedback transistor is a first feedback transistor, and further comprising:

a second operational amplifier comprising a first input coupled to the set of transistors; and a second feedback transistor comprising a gate coupled to the output of the second operational amplifier, a drain coupled to an input of the first operational amplifier and a source coupled to the first input of the second operational amplifier.

20. A current driver, comprising:

a first operational amplifier comprising a first input port configured to receive a reference signal and a second input port configured to receive a variable signal, the variable signal being proportional to an output current of the current driver, the reference signal corresponding to a selected maximum output current of the current driver;

a first feedback transistor comprising a gate coupled to the output of the first operational amplifier;

a summing junction coupled to a drain of the first feedback transistor and configured to receive a signal from the drain to enable clamping of the output current of the current driver to the maximum output current when the variable signal exceeds the reference signal, the summing junction being coupled to an H-Bridge circuit;

a damping resistor coupled between the summing junction and the H-bridge circuit;

the H-bridge circuit configured to provide the output current of the current driver and coupled to an actuator coil of a camera module having autofocusing functionality;

a transconductance amplifier configured to receive an input signal to the current driver;

a current gain stage circuit comprising the summing junction and coupled to an output of the transconductance amplifier;

a digital-to-analog converter (DAC) coupled to the first feedback transistor and configured to provide the reference voltage;

a second operational amplifier comprising a first input coupled to the H-bridge circuit; and a second feedback transistor comprising a gate coupled to the output of the second operational amplifier, a drain coupled to an input of the first operational amplifier and a source coupled to the first input of the second operational amplifier.

* * * * *

UNITED STATES PATENT AND TRADEMARK OFFICE
CERTIFICATE OF CORRECTION

| | | |
|---|---|---|
| PATENT NO. | : 8,736,316 B2 | Page 1 of 1 |
| APPLICATION NO. | : 13/650714 | |
| DATED | : May 27, 2014 | |
| INVENTOR(S) | : Virag V. Chaware et al. | |

It is certified that error appears in the above-identified patent and that said Letters Patent is hereby corrected as shown below:

In the Specification

Column 2, Line 39, delete "an" and replace with --a--.

Column 2, Line 49, delete "applications one" and replace with --applications. In one--.

Column 2, Line 62, delete "(MOSFETs)" and replace with --(nMOSFETs)--.

Column 3, Line 4, delete "42h" and replace with --42b--.

Column 3, Line 28-29, delete "transconductance amplifier transconductance amplifier 102" and replace with --transconductance amplifier 102--.

Column 3, Line 43, delete "transistor 112" and replace with --transistor M2--.

Column 3, Line 64, delete "op snap 112" and replace with --op amp 112--.

Column 4, Line 65, delete "Vinci" and replace with --Vind--.

Column 5, Line 37, delete "(BIT)" and replace with --BJT--.

Signed and Sealed this
Twenty-fifth Day of August, 2015

Michelle K. Lee
*Director of the United States Patent and Trademark Office*